(12) United States Patent
Ogras et al.

(10) Patent No.: US 9,984,962 B2
(45) Date of Patent: May 29, 2018

(54) SYSTEMS AND METHODS FOR HYBRID FLEXIBLE ELECTRONICS WITH RIGID INTEGRATED CIRCUITS

(71) Applicants: Umit Y. Ogras, Tempe, AZ (US); Ujjwal Gupta, Tempe, AZ (US); Md Ali Muztoba, Tempe, AZ (US)

(72) Inventors: Umit Y. Ogras, Tempe, AZ (US); Ujjwal Gupta, Tempe, AZ (US); Md Ali Muztoba, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days. days.

(21) Appl. No.: 15/251,512

(22) Filed: Aug. 30, 2016

(65) Prior Publication Data

US 2017/0062309 A1    Mar. 2, 2017

Related U.S. Application Data

(60) Provisional application No. 62/212,088, filed on Aug. 31, 2015.

(51) Int. Cl.
  *H01L 21/44* (2006.01)
  *H01L 23/498* (2006.01)
  *H01L 25/00* (2006.01)

(52) U.S. Cl.
  CPC .... *H01L 23/4985* (2013.01); *H01L 23/49894* (2013.01); *H01L 25/50* (2013.01)

(58) Field of Classification Search
  CPC .................. H01L 23/4985; H01L 23/49894; H01L 25/50

USPC .................. 438/107, 109, 110, 123
  See application file for complete search history.

(56) References Cited

U.S. PATENT DOCUMENTS

| | | |
|---|---|---|
| 4,495,546 A | 1/1985 | Nakamura |
| 8,912,907 B2 | 12/2014 | Gengel |
| 2007/0059951 A1* | 3/2007 | Volant .................. H01L 23/5387 439/68 |
| 2008/0083554 A1 | 4/2008 | Biskeborn |
| 2013/0243655 A1 | 9/2013 | Li |
| 2014/0224882 A1 | 8/2014 | Hacklet |
| 2016/0181288 A1 | 6/2016 | Smith |

OTHER PUBLICATIONS

U. Gupta, et al., "Can Systems Extend to Polymer? SoP Architecture Design and Challenges", 28th IEEE Systme-on-Chip Conferences (SOCC) Sep. 8-11, 2015.
L. Aluigi, et al., "Heterogeneous Integration of Flexible Substrate Spiral Antennas and Silicon Chips by Magnetic coupling", Proceedings of APMC 2012, Kaohsiung, Taiwan, pp. 848-850, Dec. 4-7, 2012.

(Continued)

*Primary Examiner* — Hung Vu
(74) *Attorney, Agent, or Firm* — Snell & Wilmer L.L.P.

(57) ABSTRACT

Systems and methods for flexible hybrid electronic (FHE) systems integrate traditional rigid integrated circuits with flexible substrates and/or interconnects. The layout and components of the system may be selected and/or optimized for a desired level of performance or flexibility. Via use of exemplary FHE system principles, improved wearable devices and other portable electronic systems may be realized.

13 Claims, 16 Drawing Sheets

(56) References Cited

OTHER PUBLICATIONS

J. Wolf, et al., "Ultra-thin Silicon Chips in Flexible Microsystems", 13th Electronic Circuits World Convention (ECWC13), May 7-9, 2014, Nürnberg, Germany.

T. Shuto, et al., "Low-Temperature Bonding of LSI Chips to PEN Film Using Au Cone Bump for Heterogeneous Integration", 2011 IEEE International 3D Systems Integration Conference (3DIC), 2011.

H. Onoe, et al., "Three-Dimensional Integration of Heterogeneous Silicon Micro-Structures by Liftoff and Stamping Transfer", J. Micromech. Microeng., 17, pp. 1818-1827, 2007.

L. Xie, "Heterogeneous Integration of Silicon and Printed Electronics for Intelligent Sensing Devices", KTH School of Information and Communication Technology, PhD thesis, Stockholm, Sweden, 2014.

R. Reuss, et al., "Special Issue on Advanced Flexible Electronics for Sensing Applications", Proceedings of the IEEE, vol. 103, No. 4, pp. 491-496, 2015.

Website of American Semiconductor, Inc., http://www.americansemi.com/, downloaded on Mar. 13, 2017.

S. Adya, et al., "Fixed-Outline Floorplanning: Enabling Hierarchical Design", IEEE Trans. on Very Large Scale Integration Systems, vol. 11, No. 6, pp. 1120-1135, 2003.

L. Carloni, et al., "Theory of Latency-Insensitive Design", IEEE Trans. on CAD of Integrated Circuits and Systems, vol. 20, No. 9, pp. 1059-1076, 2001.

J. Cortadella, et al., "Synchronous Elastic Circuits with Early Evaluation and Token Counterflow", Proc. of the Design Automation Conf, pp. 416-419, 2007.

H. Ebihara, et al., "P-39: A Flexible 16kb SRAM Based on Low-Temperature Poly-Silicon (LTPS) TFT Technology", Symp. Digest of Tech. Papers Wiley Online Lib., vol. 37, No. 1, pp. 339-342, 2006.

S. Gowrisanker, et al., "A Novel Low Temperature Integration of Hybrid CMOS Devices on Flexible Substrates", Organic Electronics, vol. 10, No. 7, pp. 1217-1222, 2009.

Y. Hu, et al. "A Self-Powered System for Large-Scale Strain Sensing by Combining CMOS ICs with Large-Area Electronics", IEEE Journal of Solid-State Circuits, vol. 49, No. 4, pp. 838-850, 2014.

T. Huang, et al., "Robust Circuit Design for Flexible Electronics", IEEE Design and Test of Computers, vol. 28, No. 6, pp. 8-15, 2011.

T. Huang, et al., "Pseudo-CMOS: A Novel Design Style for Flexible Electronics", Proc. of Conf. on Design Automation & Test in Europe, pp. 154-159, 2010.

T. Huang, et al., "Design, Automation, and Test for Low-Power and Reliable Flexible Electronics", Foundation and Trends in EDA, vol. 9, No. 2, pp. 99-210, 2015.

H. Katz, et al., "Thin-Film Organic Electronic Devices", Annual Review of Materials Research, vol. 39, pp. 71-92, 2009.

M. Koo, et al., "Bendable Inorganic Thin-Film Battery for Fully Flexible Electronic Systems", Nano Letters, vol. 12, No. 9, pp. 4810-4816, 2012.

L. Lai, et al., "SlackProbe: A Low Overhead In Situ On-line Timing Slack Monitoring Methodology", Proc. of DATE, EDAA, pp. 282-287, 2013.

T. Moy, et al., "Thin-Film Circuits for Scalable Interfacing Between Large-Area Electronics and CMOS ICs", Device Research Conference, pp. 271-272, 2014.

A. Nathan, et al., "Flexible Electronics: The Next Ubiquitous Platform", Proc. of IEEE, vol. 100, pp. 1486-1517, 2012.

K. Nomura, et al., "Room-Temperature Fabrication of Transparent Flexible Thin-Film Transistors using Amorphous Oxide Semiconductors", Nature Publishing Group, vol. 432, No. 7016, pp. 488-492, 2004.

S. Nowick, et al., "Asynchronous Design Part 1: Overview and Recent Advances", IEEE Design Test, vol. 32, No. 3, pp. 5-18, May/Jun. 2015.

T. Sekitani, et al. "Ultraflexible Organic Field-Effect Transistors Embedded at a Neutral Strain Position", Applied Physics Letters, vol. 87, No. 17, pp. 173502-1-173502-3, 2005.

T. Someya, et al. "Conformable, Flexible, Large-Area Networks of Pressure and Thermal Sensors With Organic Transistor Active Matrixes", Proc. of the National Acad. of Sci. USA, vol. 102, No. 35, pp. 12321-12325, 2005.

A. Sou, et al., "Programmable Logic Circuits for Functional Integrated Smart Plastic Systems", Elsevier; Organic Electronics, vol. 15, No. 11, pp. 3111-3119, 2014.

D. Sun, et al. "Flexible High-Performance Carbon Nanotube Integrated Circuits", Nature Nanotech., vol. 6, No. 3, pp. 156-161, 2011.

K. Takechi, et al. "Transfer Processes for Thermally Stable Large-Size TFT Flexible Substrates", IEEE Trans. on Semi. Mfg., vol. 20, No. 1, pp. 20-25, 2007.

W. Wong, et al., "Flexible Electronics: Materials and Applications", Springer Science + Business Media, vol. 24, 2009.

F. Zhang, et al., "Polymer Photovoltaic Cells with Conducting Polymer Anodes", Advanced Materials, vol. 14, No. 9, pp. 662-665, 2002.

D. Hackler, et al., "Enabling Electronics with Physically Flexible ICs and Hybrid Manufacturing", in Proceedings of the IEEE, vol. 103, Issue 4, pp. 633-643, Apr. 2015.

Teledyne Electronic Technologies, "Flexible Circuit Design Guide", Fourth Edition, 2000.

\* cited by examiner

SYSTEMS AND METHODS FOR HYBRID FLEXIBLE ELECTRONICS WITH RIGID INTEGRATED CIRCUITS

CROSS-REFERENCE TO RELATED APPLICATIONS

This application claims priority to, and the benefit of, U.S. Provisional Application Ser. No. 62/212,088 filed on Aug. 31, 2015 and entitled "HYBRID FLEXIBLE ELECTRONICS WITH RIGID INTEGRATED CIRCUITS". The foregoing application is hereby incorporated by reference in its entirety for all purposes.

TECHNICAL FIELD

The present disclosure relates to flexible electronics, and in particular to integration of flexible and conventional silicon electronics.

BACKGROUND

Mechanically bendable, rollable, conformal, or elastic circuits, commonly known as flexible electronics, are emerging as a promising alternative to conventional rigid circuits. Flexible electronics are lighter, thinner and less expensive to manufacture. Hence, they can enable wearable systems, such as electronic shirts, ties, and firefighter jackets, as well as arbitrarily shaped objects like electronic labels. Current successful examples of flexible electronics include displays, sensors, photovoltaic cells, batteries, simple micro-controllers, and radio frequency (RF) transmitters. Despite their huge potential in terms of new applications, flexible electronics suffer severely from lower degrees of integration, limited performance and larger parameter variations compared to the state-of-the-art silicon technology. Accordingly, improved systems and techniques for integrating flexible and rigid electronic components are desirable.

BRIEF DESCRIPTION OF THE DRAWINGS

With reference to the following description, appended claims, and accompanying drawings:

DETAILED DESCRIPTION

The following description is of various exemplary embodiments only, and is not intended to limit the scope, applicability or configuration of the present disclosure in any way. Rather, the following description is intended to provide a convenient illustration for implementing various embodiments including the best mode. As will become apparent, various changes may be made in the function and arrangement of the elements described in these embodiments without departing from the scope of principles of the present disclosure.

For the sake of brevity, conventional techniques for microelectronics fabrication and integration, as well as polymer engineering, flexible electronics, and/or the like may not be described in detail herein. Furthermore, the connecting lines shown in various figures contained herein are intended to represent exemplary functional relationships and/or physical couplings between various elements. It should be noted that many alternative or additional functional relationships or physical connections may be present in a practical flexible hybrid electronic (FHE) system or in related systems or methods.

Despite their huge potential in terms of new applications, flexible electronics suffer severely from lower degrees of integration, limited performance, and larger parameter variations compared to the state of art silicon technology. For example, silicon technology offers 14 nm feature size with an operating frequency in the order of 3 GHz, while feature sizes of thin film transistors range from 8 nm to 50 nm, and operating frequencies rarely exceed 10 MHz. While this huge capacity gap can be reduced by novel approaches, such as carbon-based semiconductors, flexible electronics are far from implementing a full-fledged multiprocessor system-on-chip with power and performance figures competitive with silicon technology. Therefore, alternative approaches employing flexible hybrid electronics permit truly wearable personalized computing systems that integrate flexible display, sensors, and battery with conventional chips, in accordance with principles of the present disclosure and as shown in FIGS. 1A through 1D. The concept behind this hybrid approach is to use silicon ICs where high processing and storage capability is needed, while reverting back to flexible electronics for other portions to maintain the benefits of flexibility.

Figure 1A:
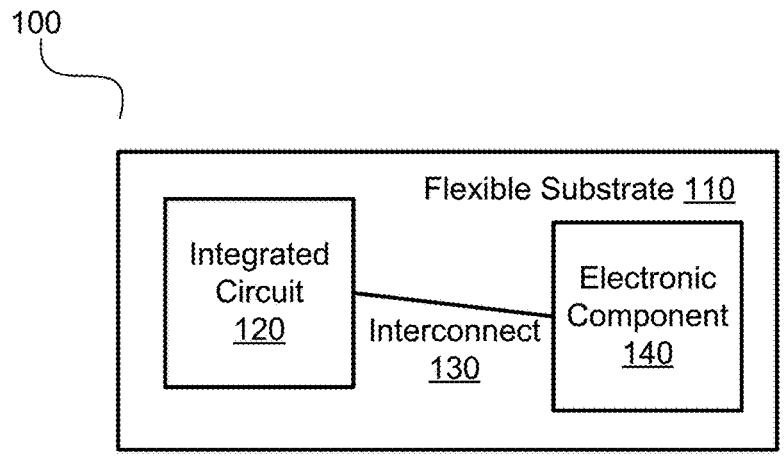
FIG. 1A illustrates components of an exemplary flexible hybrid electronics system in accordance with an exemplary embodiment.
Figure 1B:
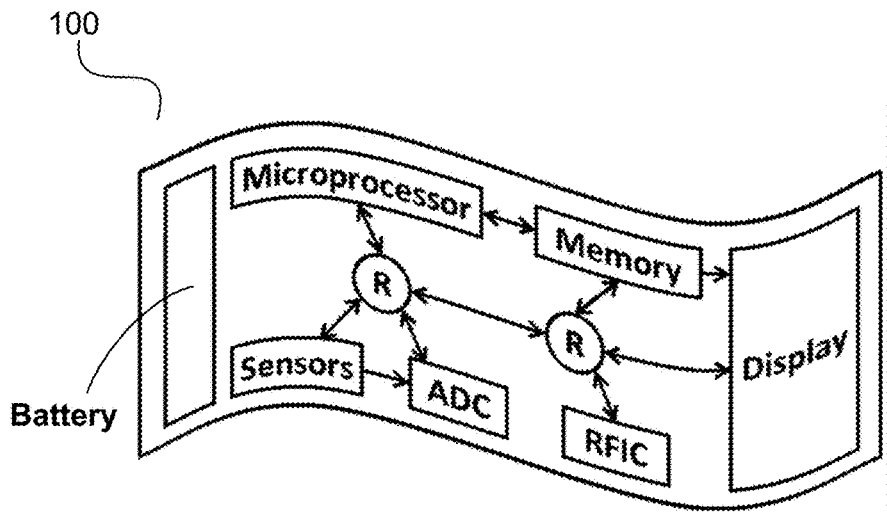
FIG. 1B and FIG. 1C illustrates exemplary System-on-Polymer architectures in accordance with various exemplary embodiments.
Figure 1C:
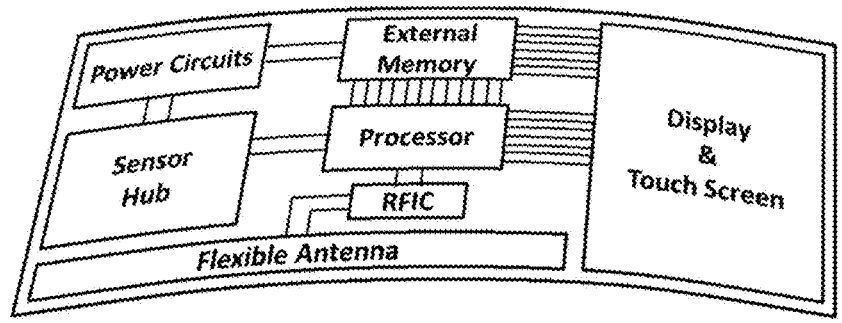
Figure 1D:
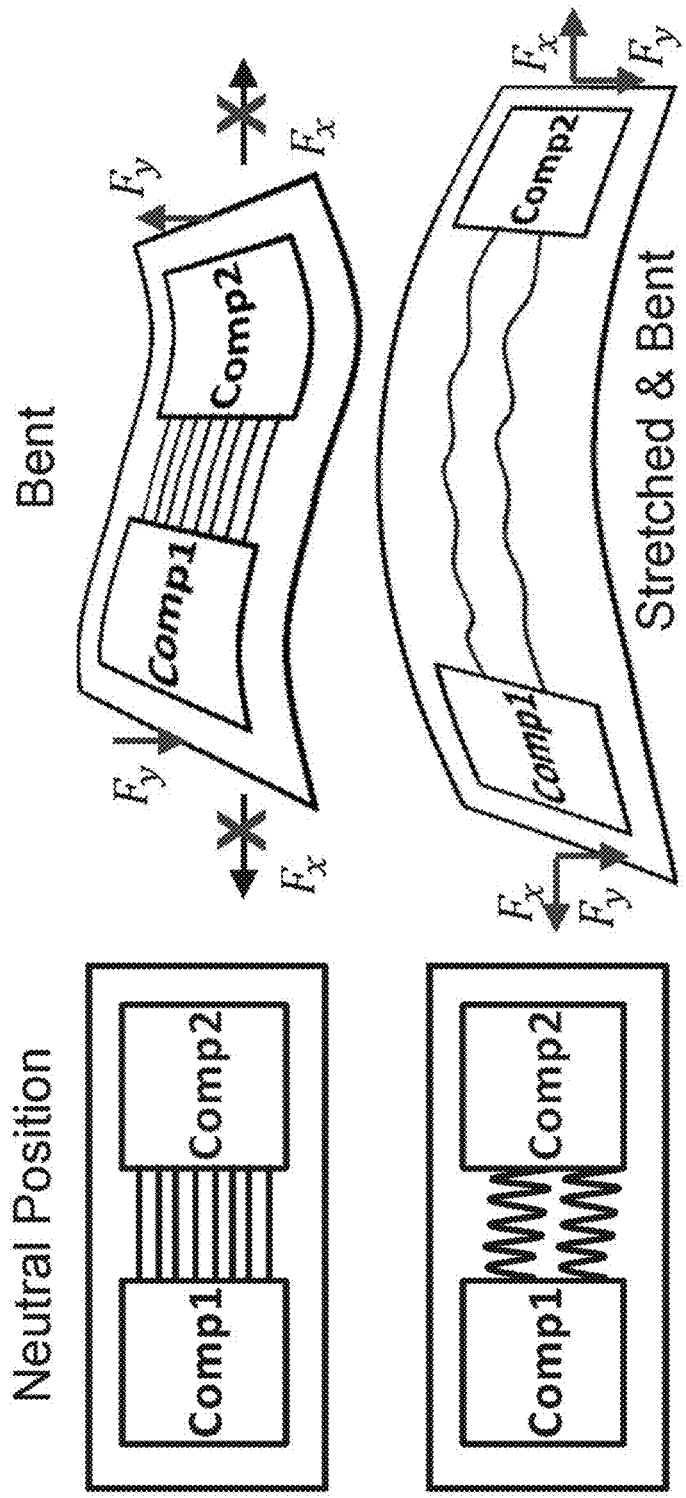
FIG. 1D illustrates relaxed and deformed examples of exemplary flexible hybrid electronics systems in accordance with various exemplary embodiments.

With reference now to FIG. 1A, in an exemplary embodiment a flexible hybrid electronics system 100 comprises a flexible substrate 110. On and/or in flexible substrate 110, other electronic components, such as integrated circuit 120, electronic component 140 (for example, various resistors, capacitors, inductors, transistors, diodes, light-emitting diodes, switches, traces, jumpers, fuses, amplifiers, antennas, and so forth) are coupled via a series of electrical interconnects 130. Examples of flexible hybrid electronic systems are shown in FIGS. 1B and 1C. It will be appreciated that, depending on a desired functionality, size, or flexibility level of flexible hybrid electronics system 100, it may include any suitable types of (and/or number of) integrated circuits 120, electronic components 140, and/or the like.

Mechanically flexible and conformal-shaped electronics are gaining unprecedented momentum in today's electronics ecosystem. Rapid progress at device and circuit levels is already underway, but prior approaches have yet to envision the system design in a flexible form. To combine the advantages of flexible electronics and traditional silicon technology, disclosed herein are hybrid flexible systems. Hybrid flexible electronics are used to implement complex systems on flexible substrates. The term "hybrid" implies integration of flexible substrates and circuits with rigid ICs. Since the most common flexible substrates are plastic, polymer and paper, the present disclosure utilizes the term "SoP," which stands for Systems-on-{Polymer, Plastic or Paper}. The idea behind this hybrid approach is to use silicon ICs where high performance, processing and storage capabilities are needed, while reverting to flexible electronics for everything else to maintain the benefits of flexibility. By integrating flexible display, sensors, and battery with conventional chips, this architecture allows for a wide spectrum of systems ranging from simple internet-of-things (IoT) devices to complete mobile platforms like smartphones. Therefore, systems-on-polymer have the potential to transform personal computing by enabling arbitrary shaped wearable systems not limited to desks, laps or hands.

An important difference between SoPs and System-on-Chip (SoC) is the physical flexibility. Therefore, a complete SoP architecture, such as the one illustrated in FIGS. 1A through 1D, may utilize a formal definition and use of "flexibility" as a new metric. A larger number of silicon ICs are desired to boost the processing power, because flexible electronics exhibit poor performance and scalability. However, using a large number of silicon ICs and their ad-hoc placement would undermine the advantages of flexibility. Furthermore, introducing flexibility also introduces novel challenges, such as placement of rigid ICs onto flexible substrates, and aggravates existing communication, reliability, power and thermal challenges. Hence, creation and use of an FHE system exhibits an inherent design trade-off between flexibility and computational efficiency.

Principles of the present disclosure contemplate use of flexibility as a design metric in addition to the standard power, performance and area metrics. As shown in the various exemplary embodiments herein, it will be appreciated that flexibility is not only an important metric on its own, but it also results in an interesting trade-off with performance and area. To optimize this trade-off, exemplary embodiments utilize an optimization approach to place the rigid ICs onto flexible substrates. As disclosed herein, intuitive placement can lead to as much as 5.7× loss in flexibility compared to the optimal placement.

Accordingly, the present disclosure: defines flexibility as a new design metric in addition to area, power, and performance; introduces SoP architectures and discusses corresponding design challenges; presents a methodology for the optimal placement of rigid ICs on a flexible substrate to minimize the loss in flexibility; and discloses various exemplary flexible hybrid electronic systems, such as an exemplary FHE system utilizable for motion tracking and processing.

Because flexible components have significantly lower performance compared to CMOS technology, using hybrid flexible electronics is encouraged by national research agencies. Integration of CMOS devices on flexible substrates has recently been demonstrated at research centers including ASU Flexible Display Center, industry, and academia. However, prior approaches mainly aimed at individual devices. Furthermore, prior approaches did not contemplate a method and system for the systematic design of flexible hybrid electronics systems.

Physical flexibility is a new design dimension that typically has not been considered by computer system designers. In order to incorporate flexibility in the design process, exemplary systems and methods quantify the maximum deflection of a flexible substrate as a measure of flexibility. This formalism enables the system and method to treat flexibility as a measurable design metric. For example, it becomes possible to minimize the loss of flexibility under power/performance constraints, or impose a constraint on the loss in flexibility due to a rigid component. Under these conditions, exemplary systems and methods present a design methodology for optimally placing rigid components on a flexible substrate with the objective of minimizing the loss in flexibility.

Figure 2:
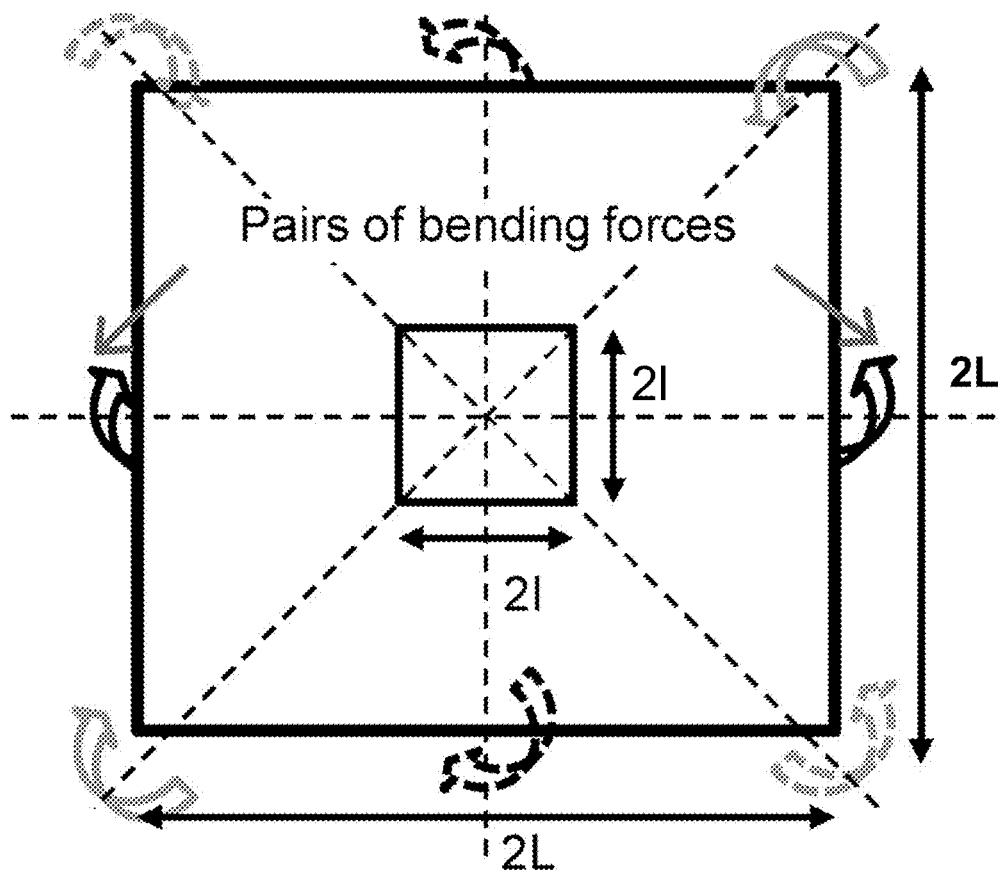
FIG. 2 illustrates an exemplary flexible hybrid electronic system, illustrating potential uniform force-bending pairs in accordance with an exemplary embodiment.

Consider a simple hybrid flexible system with one rigid component placed over a flexible substrate, as illustrated in FIG. 2. In this example, the flexible substrate is a flat, homogenous isotropic material with uniform thickness. FIG. 2 shows four pairs of uniformly distributed major bending forces that can be applied on the flexible substrate. All forces are normal to the plane of the flexible surface and uniformly distributed along the bending axis. Exemplary systems and methods may utilize the maximum deflection on either side to examine flexibility loss.

Flexibility Metric for Flexible Hybrid Systems.

Figure 3:
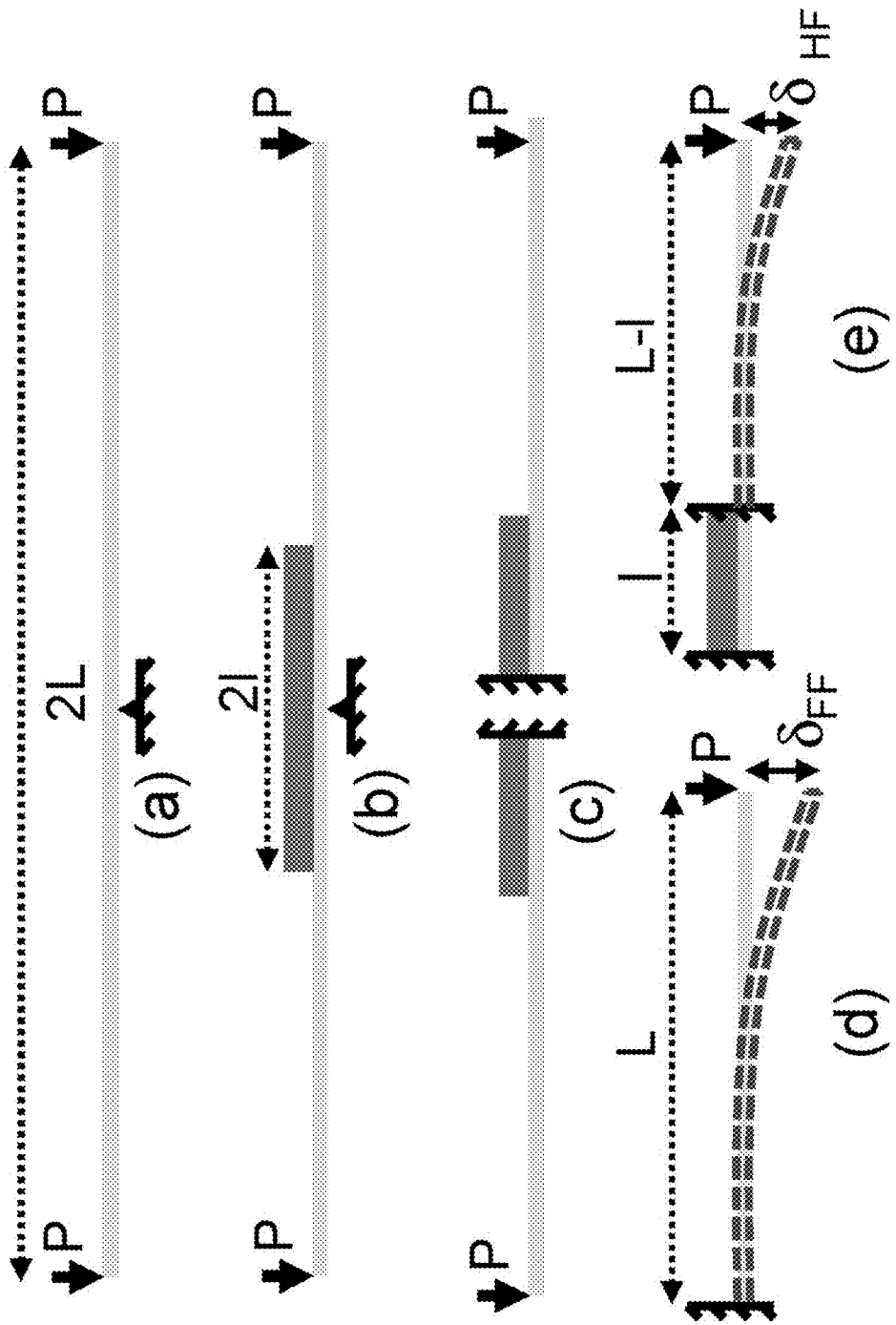
FIG. 3 illustrates procedures for characterizing a flexible hybrid electronics system in accordance with an exemplary embodiment.

In various exemplary embodiments, to analyze the impact of the relative size of a rigid component on flexibility, exemplary systems and methods may consider a rigid integrated circuit (IC) of dimension 2 1×2 1 mounted over flexible substrate of dimension 2 L×2 L, as shown in FIG. 2. An exemplary approach models this hybrid flexible system using two cantilever beams. First, the side-view of the flexible substrate alone and equivalent forces with pivot point are shown in FIG. 3, part (a). Then, the corresponding view for the hybrid flexible system is shown in FIG. 3, part (b). The deflection at the sides may be analyzed as two separate cantilever beams, as shown in FIG. 3, part (c). In reality, the shear stress at the pivot will make some difference in the analysis of the pivoted beam and cantilever, but it is marginal and can be neglected due to thin flexible substrate. Cantilever beams with and without the rigid component are shown in FIG. 3, part (d) and part (e), respectively. FIG. 3, part (e) shows that adding a rigid component decreases the effective length of the cantilever beam.

In accordance with an exemplary embodiment, an exemplary approach expresses the maximum deflection in a cantilever beam as a function of the uniformly distributed force P applied at one end (point force), modulus of elasticity E, and moment of area I:

$$\delta_{max} = \frac{L^3 \cdot P}{3 \cdot E \cdot I}.$$

Hence, the maximum deflection in the fully flexible ($\delta_{FF}$) and hybrid flexible ($\delta_{HF}$) systems shown in FIG. 3, part (d) and part (e) are given by:

$$\delta_{FF} = \frac{L^3 \cdot P_{max}}{3 \cdot E \cdot I} \text{ and } \delta_{HF} = \frac{(L-l)^3 \cdot P_{max}}{3 \cdot E \cdot I} \quad \text{(Equation 1)}$$

where $P_{max}$ is the maximum force the substrate can sustain before breaking. If the contact (e.g., soldering) between the rigid component and flexible substrate is weaker than the flexible substrate, $P_{max}$ will become smaller than actual material breaking force. Then, we can find the reduction in deflection using Equation 1 as:

$$\text{Deflection Loss} = \frac{\delta_{FF} - \delta_{HF}}{\delta_{FF}} = \frac{L^3 - (L-l)^3}{L^3} \quad \text{(Equation 2)}$$

Figure 4:
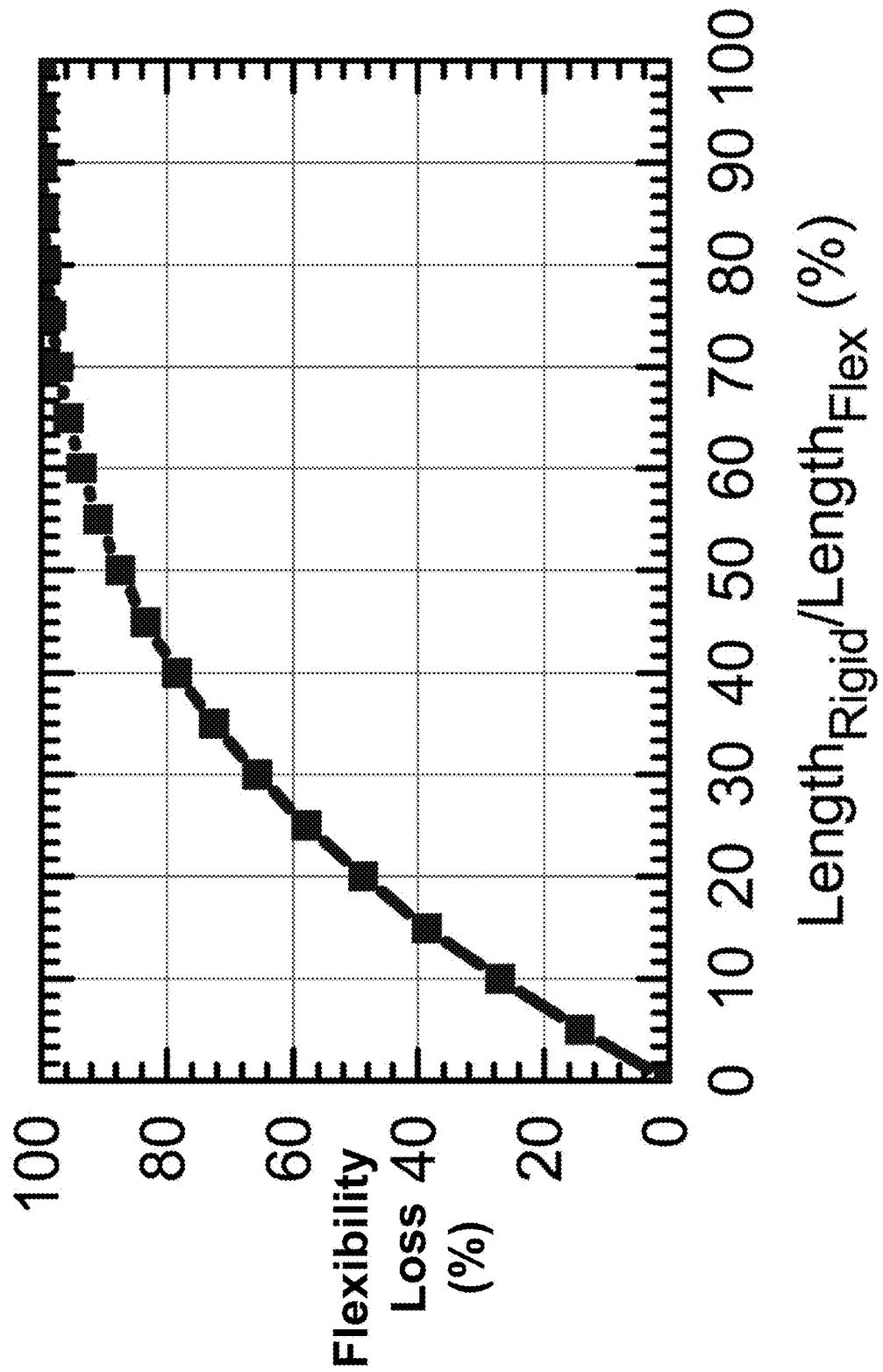
FIG. 4 illustrates flexibility loss in an exemplary flexible hybrid electronics system in accordance with an exemplary embodiment.

In various exemplary embodiments, the loss in flexibility is plotted in FIG. 4 using Equation 2 as a function of the ratio between the lengths of a rigid component and the flexible substrate. For example, when the rigid component is 20% in length compared to the flexible portion, the flexibility loss is 45%. It will be appreciated that increasing the area of the rigid IC quickly diminishes the flexibility. Since moving more functionality to the rigid ICs implies higher performance and area, Equation 1 enables analyzing the tradeoff between the new flexibility metric and classical metrics such as area and performance.

In some exemplary embodiments disclosed above, in FHE system 100 a rigid IC is placed at the center. However, other exemplary embodiments contemplate other locations for rigid components of FHE system 100. For example, if a rigid IC is placed at an arbitrary location x from one end point, as depicted in FIG. 3, part (b), then the total displacement at both ends can be found as:

$$\delta_{HF} = \frac{x^3 P_{max}}{3EI} + \frac{(2L - 2l - x)^3 P_{max}}{3EI} \quad \text{(Equation 3)}$$

Optimal Placement of Rigid Components.

Exemplary systems and methods utilize a methodology to find an optimum placement of rigid components on a flexible substrate to minimize the flexibility loss. In one exemplary approach, an exemplary method considers a scenario in which n ICs are desired to be placed on a substrate of width W and height H. The width and height of the ith IC is denoted by $l_i$, li and $h_i$, respectively. The substrate is large enough such that substrate width $W \geq \Sigma_{i=1}^N l_i$ and height $H \geq \Sigma_{i=1}^N h_i$. In addition to this, the location of each IC is given by its lower left corner coordinate ($x_i$, $y_i$). Since no two ICs can occupy the same space:

$x_i + l_i < x_j \forall j \neq i$ and $y_i + h_i < y_j \forall j \neq i$

Exemplary systems and methods utilize the following two principles to maximize flexibility.

Principle 1:

Optimal placement of the rigid ICs without overlapping each other in the x-direction occurs when all the ICs are placed next to each other on one side of the substrate satisfying $x_1 = 0$ and $x_{i+1} = x_i + l_i \forall i$. The maximum deflection in this case is given as:

$$\delta = \frac{P_{max}}{3EI}\left(W - \sum_{i=1}^{N} l_i\right)^3 \quad \text{(Equation 4)}$$

Principle 2:

Optimal placement of the rigid ICs with overlapping in the x-direction occurs when all ICs completely overlap each other satisfying $x_1 = 0$ and $x_{i+1} = x_i + l_i - o_{i+1} \forall i$, where $o_{i+1} = \min(l_i, l_{i+1}) \forall i$. The maximum deflection is in this case is given as:

$$\delta = \frac{P_{max}}{3EI}(W - l_i)^3 \quad \text{(Equation 5)}$$

Figure 5:
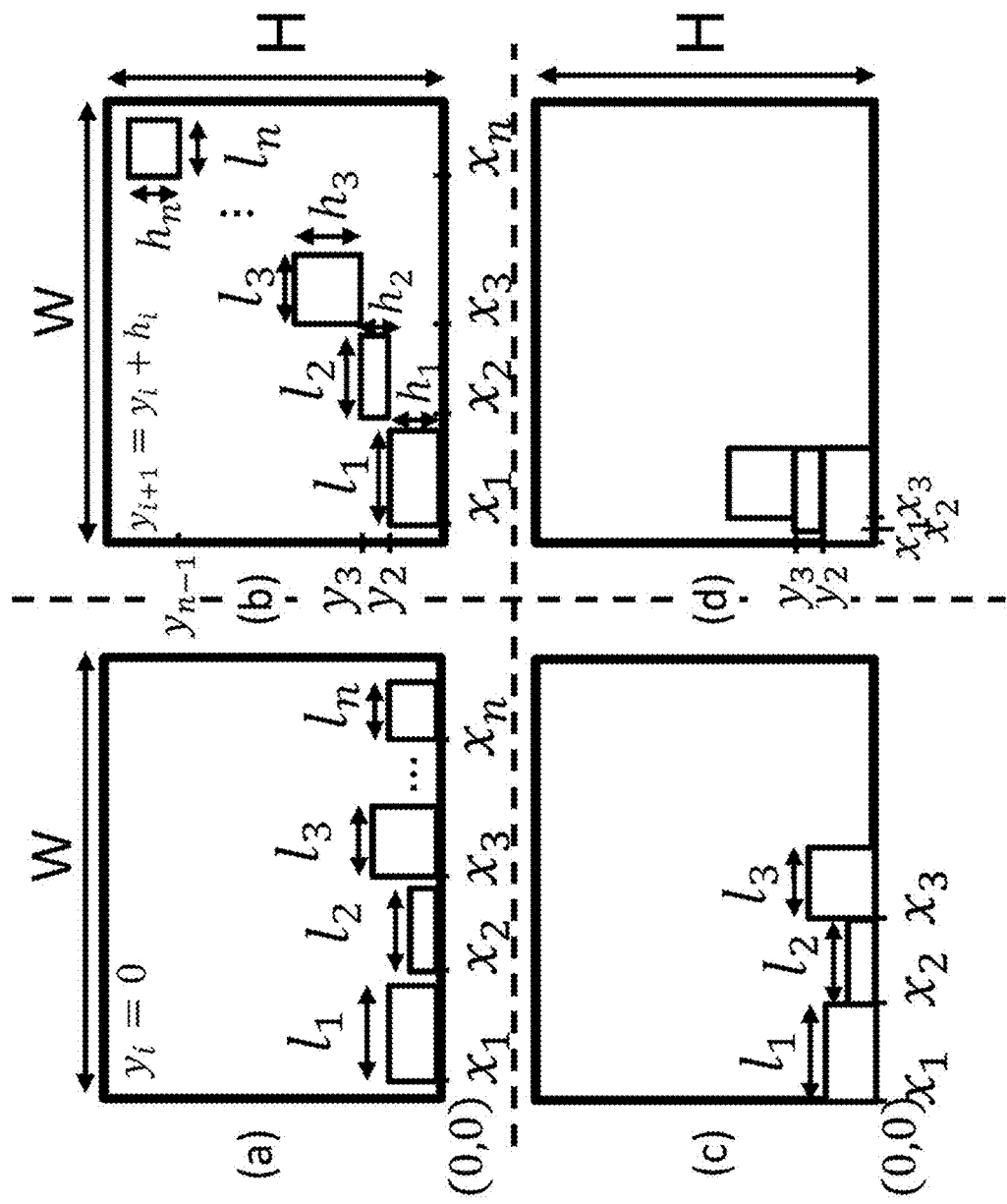
FIGS. 5 and 6 illustrate exemplary design principles for an exemplary flexible hybrid electronics system in accordance with an exemplary embodiment.

Exemplary systems and methods may utilize these two principles to place rigid ICs on the flexible substrate. For example, consider placement of three ICs (n=3), as shown in FIG. 5. If all three ICs cannot overlap in the x-direction, then using Principle 1, they are desirably placed together at one of the edges, as shown in FIG. 5, part (c). When the ICs can overlap, then using Principle 2, they are desirably placed to maximize overlap, as shown in FIG. 5, part (d). Furthermore, if two ICs can overlap, but the third one cannot then an exemplary system and method may apply Principle 1 and Principle 2 one by one.

Optimally placing the ICs to maximize flexibility becomes a combinatorial problem. For a small number of rigid ICs, an exhaustive search for optimal placement can be used to find the exact order and relative position of the ICs. When the number of ICs is large, advanced combinatorial optimization techniques can be applied. However, solving for different bending angles on top of these optimization techniques would become extremely computationally intensive. Furthermore, the solutions from using the two Principles indicate that to maximize deflection, the rigid ICs should be placed close together. Therefore, in various exemplary embodiments the rigid ICs are first packed into the smallest bounding-box with sufficient area left for interconnects using Principle 1 and Principle 2. Then, exemplary approaches define this bounding-box as the rigid area, and find its optimal placement as a function of its dimensions, orientation, position and the bending axis.

Problem Formulation.

Figure 6:
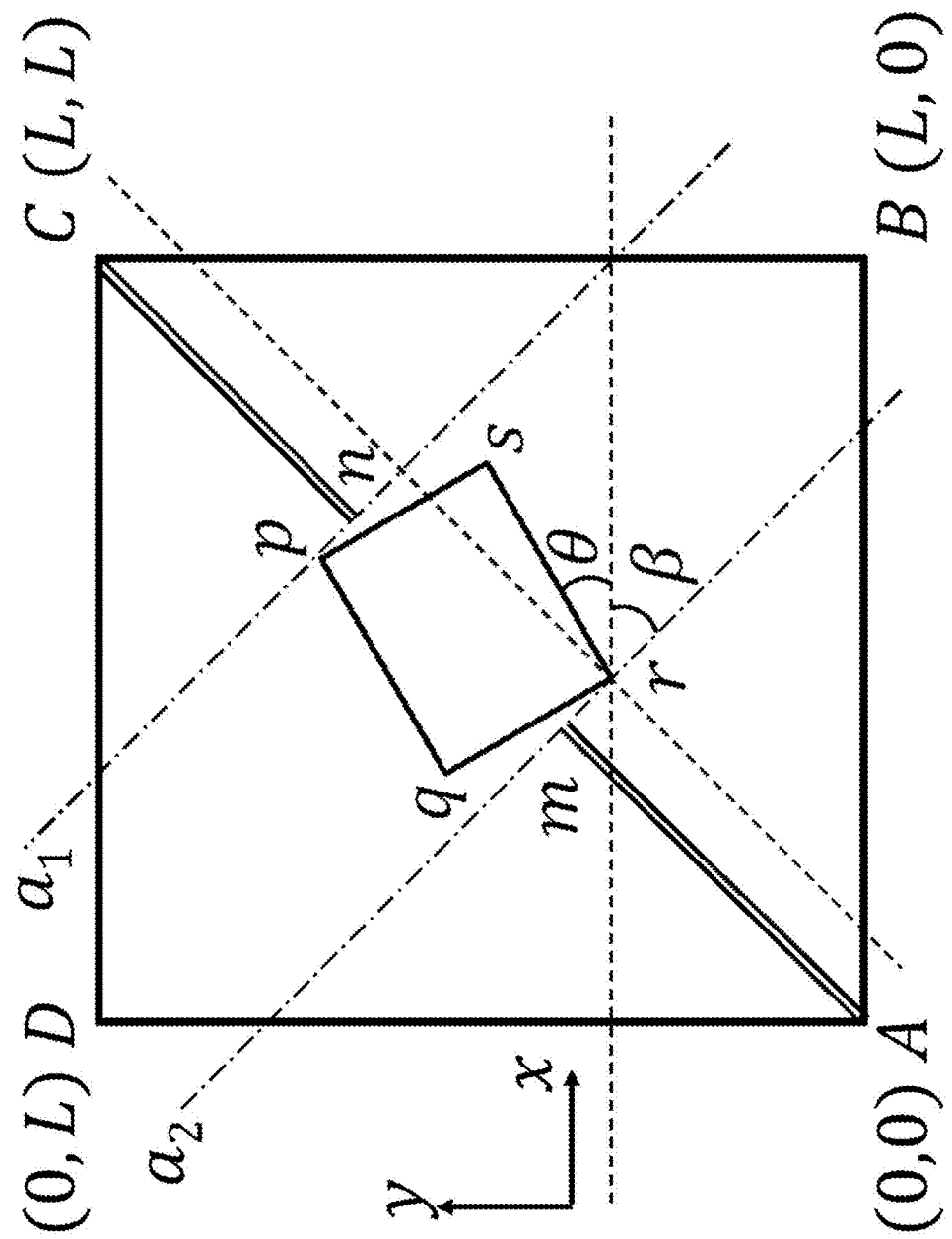

The geometric representation of a generic problem instance which may be optimized via application of principles of the present disclosure is shown in FIG. 6. Consider a flexible substrate ABCD, with the coordinates A(0,0), B(L,0), C(L,L) and D(0,L), respectively. The bounding-box pqrs is placed with an arbitrary orientation angle θ with respect to the horizontal edge of the flexible substrate. The area of the bounding-box $B_A$ is fixed, while the length l and width b are free variables where $B_A = l \times b$. Let the coordinates of point r be $(x_r, y_r)$, then the coordinates for points s, p and q can be expressed as:

$$(x_s, y_s) \equiv (x_r + b \cdot \cos\theta, y_r + b \cdot \sin\theta) \quad \text{(Equation 6)}$$

$$(x_p, y_p) \equiv (x_r + d \cdot \cos(\theta + \emptyset), y_r + d \cdot \sin(\theta + \emptyset)) \quad \text{(Equation 7)}$$

$$(x_q, y_q) \equiv \left(x_r + l \cdot \cos\left(\theta + \frac{\pi}{2}\right), y_r + l \cdot \sin\left(\theta + \frac{\pi}{2}\right)\right) \quad \text{(Equation 8)}$$

where $\emptyset = \tan^{-1}(l/b)$ and $d = \sqrt{l^2 + b^2}$.

The flexible substrate can be bent across an arbitrary bending axis such as $a_1$ and $a_2$ shown in FIG. 6. For example, when the bending angle $\beta$ (the angle between $a_2$ and x-axis) is zero, the substrate is bent horizontally, i.e., along the x-axis. Likewise, $\beta = \pi/2$ implies vertical bending along the y-axis. Exemplary approaches consider uniform bending all throughout the flexible substrate, and model the system using cantilever beams. Since deflection is proportional to the cube of length (Equation 3), the longest cantilever beam will give the largest deflection for a given amount of force applied. For example, consider the two cantilever beam models, $|Am|$ and $|Cn|$ as seen in FIG. 6. These cantilever beams are perpendicular to the two axes $a_1$ and $a_2$ and represent the largest length out of all other possible cantilevers. $|Am|$ and $|Cn|$ can be found as:

$$|Am| = x_r \cdot \sin\beta + y_r \cdot \cos\beta \quad \text{(Equation 9)}$$

$$|Cn| = (L - x_r - d \cdot \sin(\theta + \emptyset)) \cdot \sin\beta + (L - y_r - d \cdot \cos(\theta + \emptyset)) \cdot \cos\beta \quad \text{(Equation 10)}$$

In general, the total maximum deflection can be written as sum of deflections of these two cantilever beams as follows:

$$\delta(x_r, y_r, \theta, \beta, l, b) = \frac{P}{3 \cdot E \cdot I} \cdot [(x_r \cdot \sin\beta + y_r \cdot \cos\beta)^3 + ((L - x_r - d \cdot \sin(\theta + \phi)) \cdot \sin\beta + (L - y_r - d \cdot \cos(\theta + \phi)) \cdot \cos\beta)^3] \quad \text{(Equation 11)}$$

Equation 11 gives the deflection for an arbitrary bending axis with angle $\beta$. Therefore, exemplary approaches find the optimum dimensions l and b, orientation $\theta$, and location $(x_r, y_r)$ for the rigid bounding-box as a function of $\beta$. Depending on the usage scenario, it may be desirable for an exemplary FHE system 100 to bend the flexible substrate along multiple axes. For example, exemplary approaches might co-optimize for both horizontal and vertical bending instead of considering only one of them. Therefore, we define a set of bending angles, $\beta = [\beta_1, \beta_2, \beta_3 \ldots, \beta_n]$ with respective relative importance $W = [w_1, w_2, w_3 \ldots, w_n]$. As a result, exemplary approaches define the objective function as a weighted sum of deflections at different bending angles, and call it as the maximum deflection:

$$\Delta(x_r, y_r, \theta, l, b, \beta, W) = \sum_{i=1}^{N} w_i \times \delta_i(x_r, y_r, \theta, \beta_i, l, b). \quad \text{(Equation 12)}$$

Exemplary approaches aim to maximize the deflection—the flexibility metric—under the geometric constraints. In one exemplary embodiment, the method utilizes a nonlinear optimization approach of the form:

maximize $\Delta(x_r, y_r, \theta, l, b, \beta, W)$ subject to $g_c: 0 \leq x_r, y_r, x_s, y_s, x_p, y_p, x_q, y_q \leq L$, $g_\beta: 0 \leq \beta \leq \pi/2$, $g_\theta: -\min(\beta) \leq \theta \leq -\max(\beta) + \pi/2$, $g_l: l \geq L_{min}, g_b: b \geq L_{min}$ Area of bounding box: $B_A = l \times b$, $$\sum_{i=1}^{N} w_i = 1, w_i \geq 0 \,\forall\, i$$

The first inequality ensures that the bounding-box pqrs remains within the flexible substrate boundary, while the second one constrains the bending angle $g_\beta$ to the interval $[0; \pi/2]$. Similarly, $g_\theta$ constrains $\theta$ with respect to the maximum and minimum fi values. The constraints $g_\beta$ and $g_\theta$ avoid symmetric solutions. The system may also utilize constraints for the area $B_A$, minimum length and $g_l$, minimum width $g_b$ of the bounding-box. Finally, the weight of all bending angles sum to one, and all quantities except $\theta$ remain positive throughout the optimization.

Figure 7A:
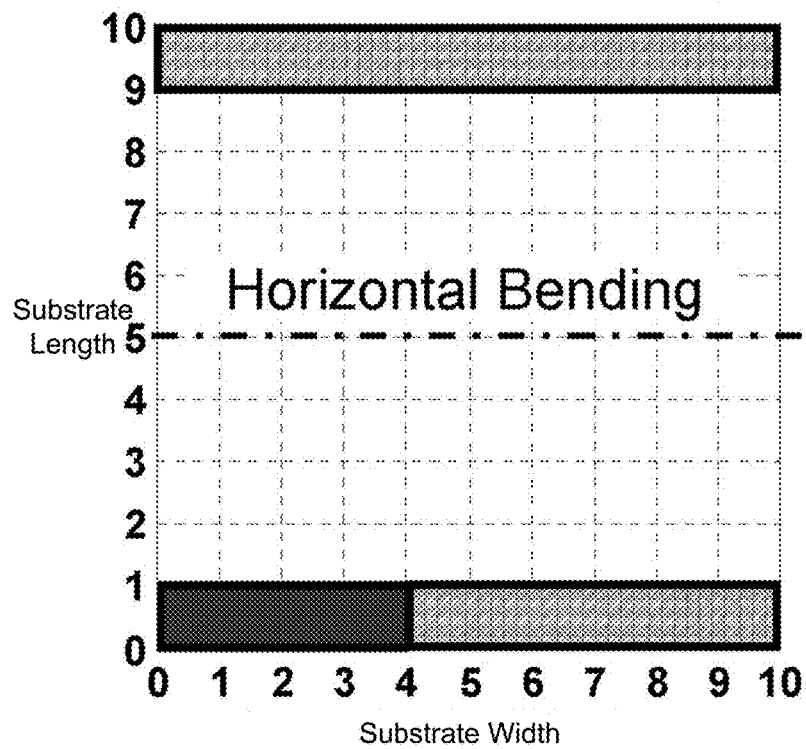
FIGS. 7A through 7H illustrate optimal bounding boxes and component placement for various exemplary flexible hybrid electronics systems under various external forces in accordance with various exemplary embodiments.
Figure 7B:
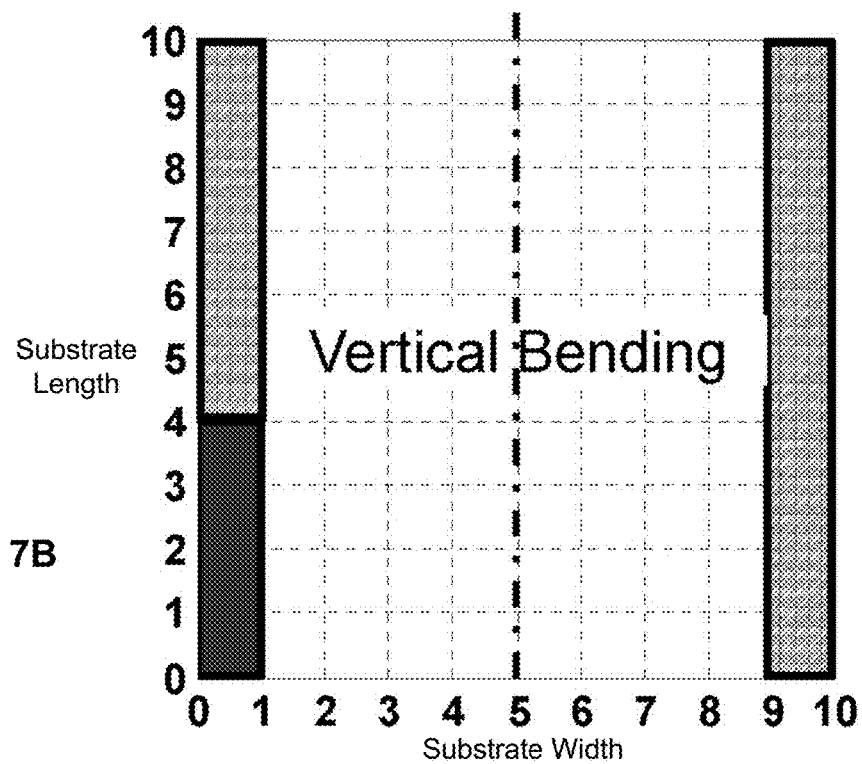
Figure 7C:
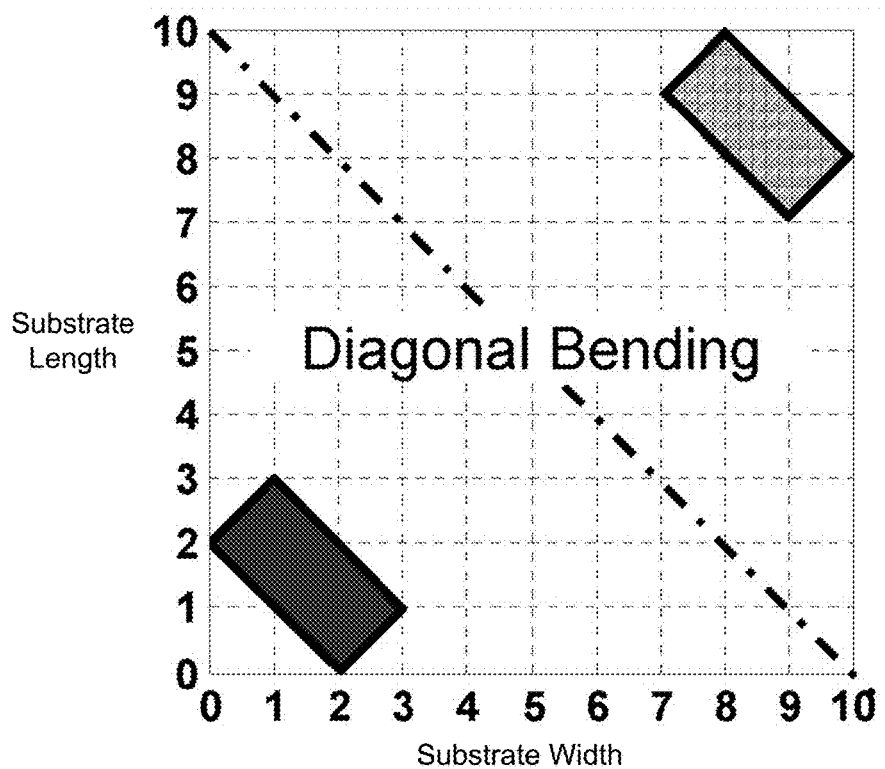

Exemplary results of application of principles of the present disclosure are shown in FIGS. 7A through 7H. In these exemplary results, the substrate has an area of 10 square units. FIG. 7A shows the optimal placement under horizontal bending (W=[1,0,0]). The optimal orientation is $\theta = 0$, while the dimension of bounding-box is 4×1. This implies that the height of the optimal bounding-box comes out to be equal to the constraint, $L_{min} = 1$. That is, the orientation is parallel to the bending axis and the dimension perpendicular to the bending axis is minimized. Furthermore, we observe that the bounding-box can be placed at either side. This makes sense since the maximum displacement depends on the cube of the distance from the side, which is maximized when the bounding-box touches at either side. Similarly, for vertical bending shown in FIG. 7B, (W=[0,0,1]), the optimal orientation is $\theta = -\pi/2$, the dimension of bounding-box is 4×1, and the placement is either at $x_r = 0$ or $x_r = 9$. When the bending is along the diagonal, as shown in FIG. 7C, the orientation is $\theta = \pi/4$. In this case, the optimal dimensions are 1.41×2.83 units, which is non-trivial unlike the previous cases, while the placement was at either corner.

Figure 7D:
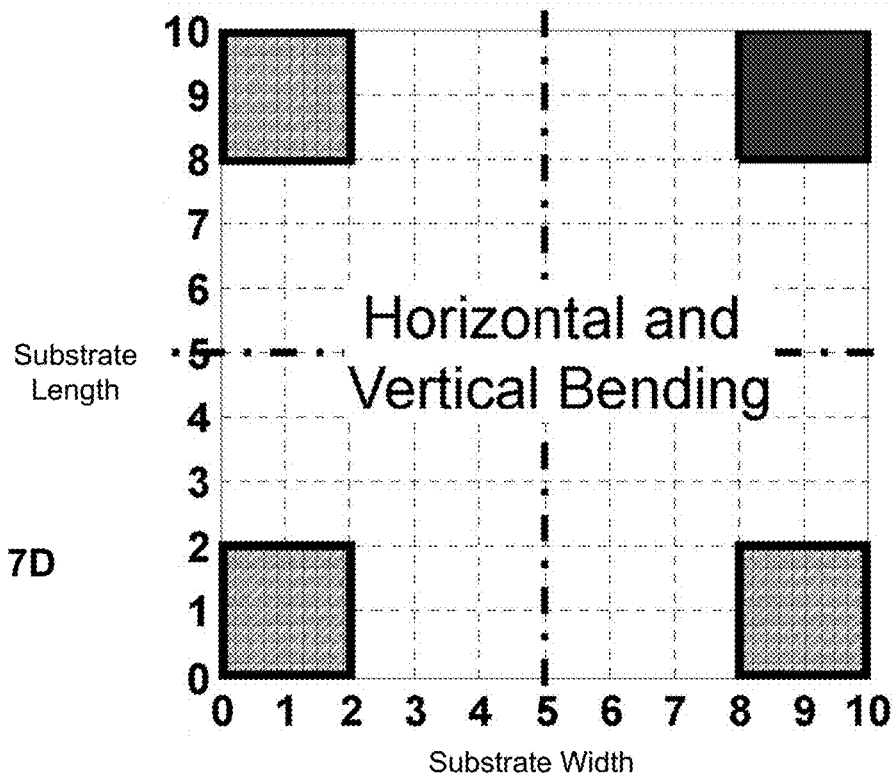
Figure 7E:
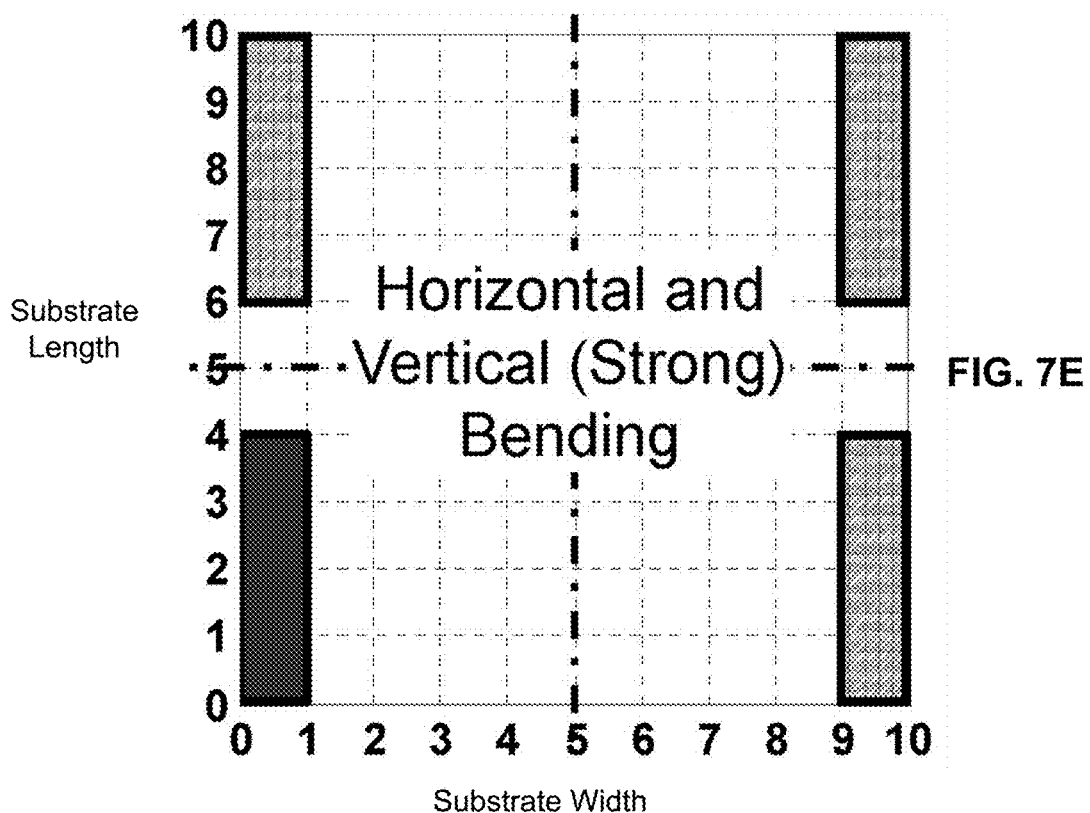
Figure 7F:
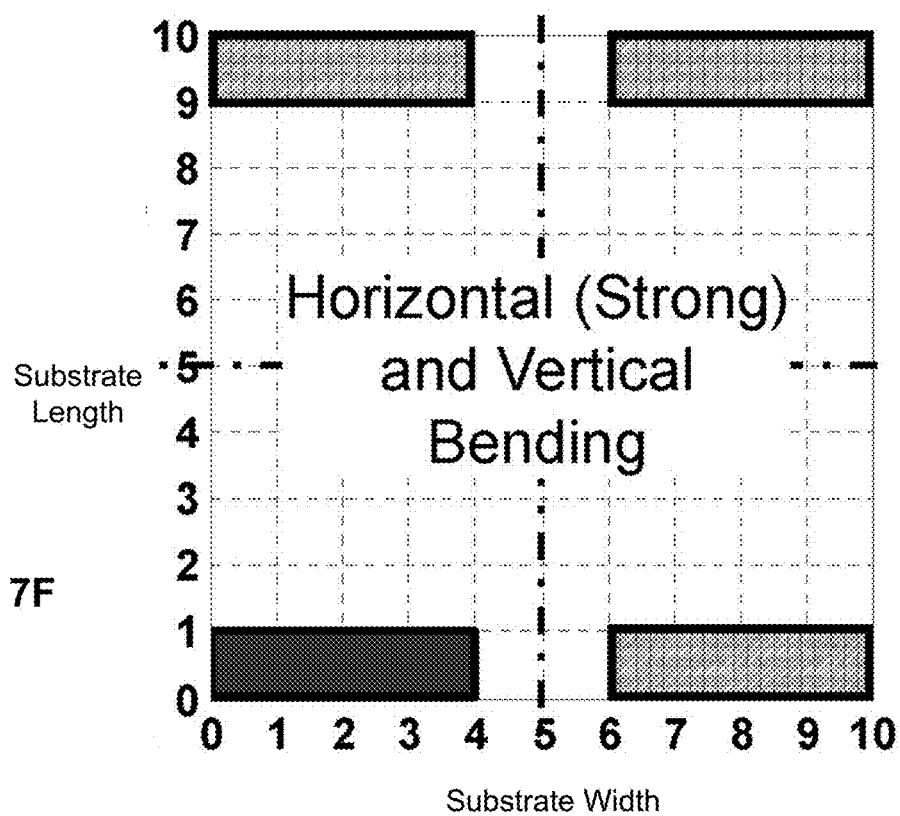
Figures 7G, 7H:
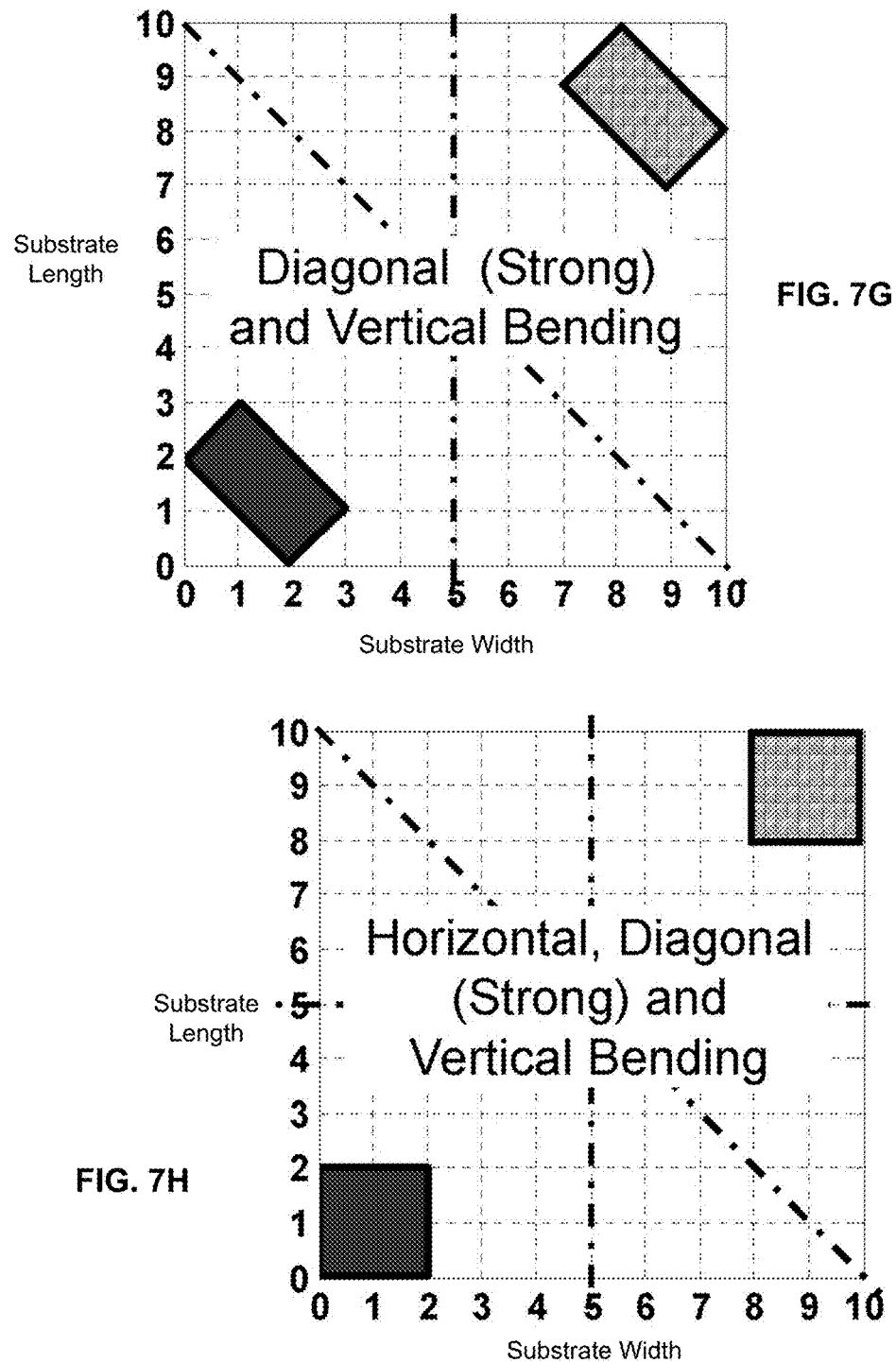

More complex scenarios with multiple bending angles are shown in FIGS. 7D through 7H. For vertical and horizontal bending together (W=[0.5,0,0.5]), the output is $\theta = 0$, the dimension of the bounding-box is 2×2, and the initial points are (0,0), (0,8), (8,0), and (8,8), as shown in FIG. 7D. Note that, the result is same irrespective of any amount of additional diagonal bending as shown in FIG. 7H. The results with W=[0.25,0,0.75], and W=[0.75,0,0.25], shown in FIGS. 7E and 7F are similar to FIGS. 7B and 7A, but all regions are not included. For strong diagonal and vertical bending (W=[0,0.75,0.25]) as shown in FIG. 7G, the result is similar to FIG. 7C, but has slightly different dimensions of bounding-box (1.46×2.73 units) and initial position (0, 1.93). The tendency is to move the bounding-box toward the corners of the flexible substrate.

Figure 8A:
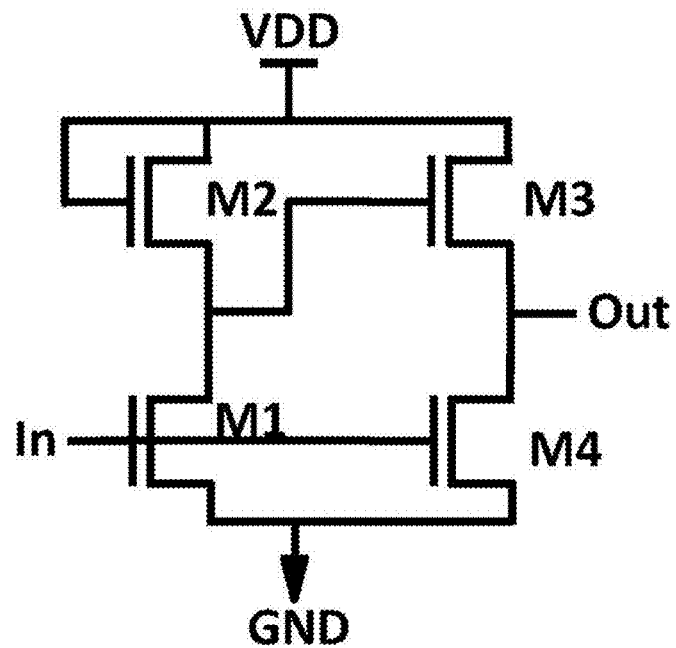
FIG. 8A illustrates an exemplary inverter for use in a flexible hybrid electronics system in accordance with various exemplary embodiments.
Figure 8B:
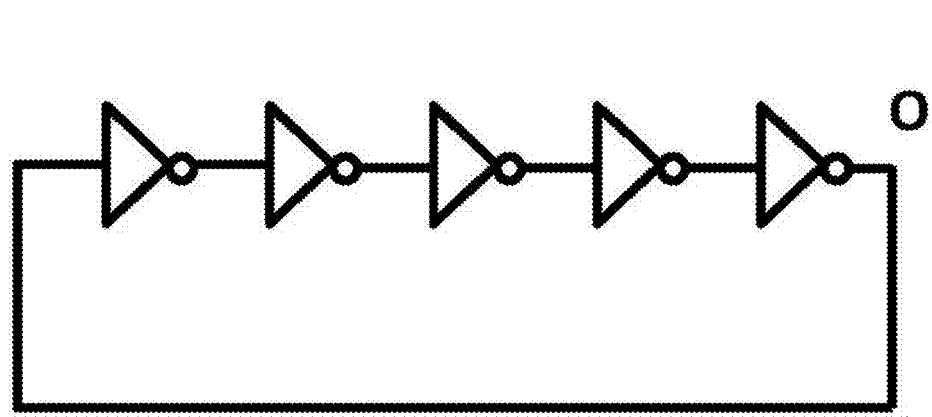
FIG. 8B illustrates a circuit diagram of a ring oscillator utilizing inverters of FIG. 8A in accordance with various exemplary embodiments.

In various exemplary embodiments, components of FHE system 100 and interplay thereof are disclosed. A flexible circuit can be bent around a several millimeter radius before strain-induced damage to circuits. Bending the substrate can change the electron mobility by as much as 20%, and affect the timing of flexible circuits. Moreover, physical changes in the substrate affect the interconnect capacitance, leading to further timing uncertainties. In various exemplary approaches, to analyze the effect of bending on flexible circuits, an exemplary FHE system 100 implemented the ring oscillator disclosed in FIGS. 8A and 8B using IGZO TFT technology. Design parameters showed a nominal frequency of 175 kHz for this circuit. Then, the bending scenario described in FIG. 9 was applied by distributing the mobility variation according to the degree of bending, and analyzed the output frequency of the ring oscillator according to this mobility variation.

Figure 9:
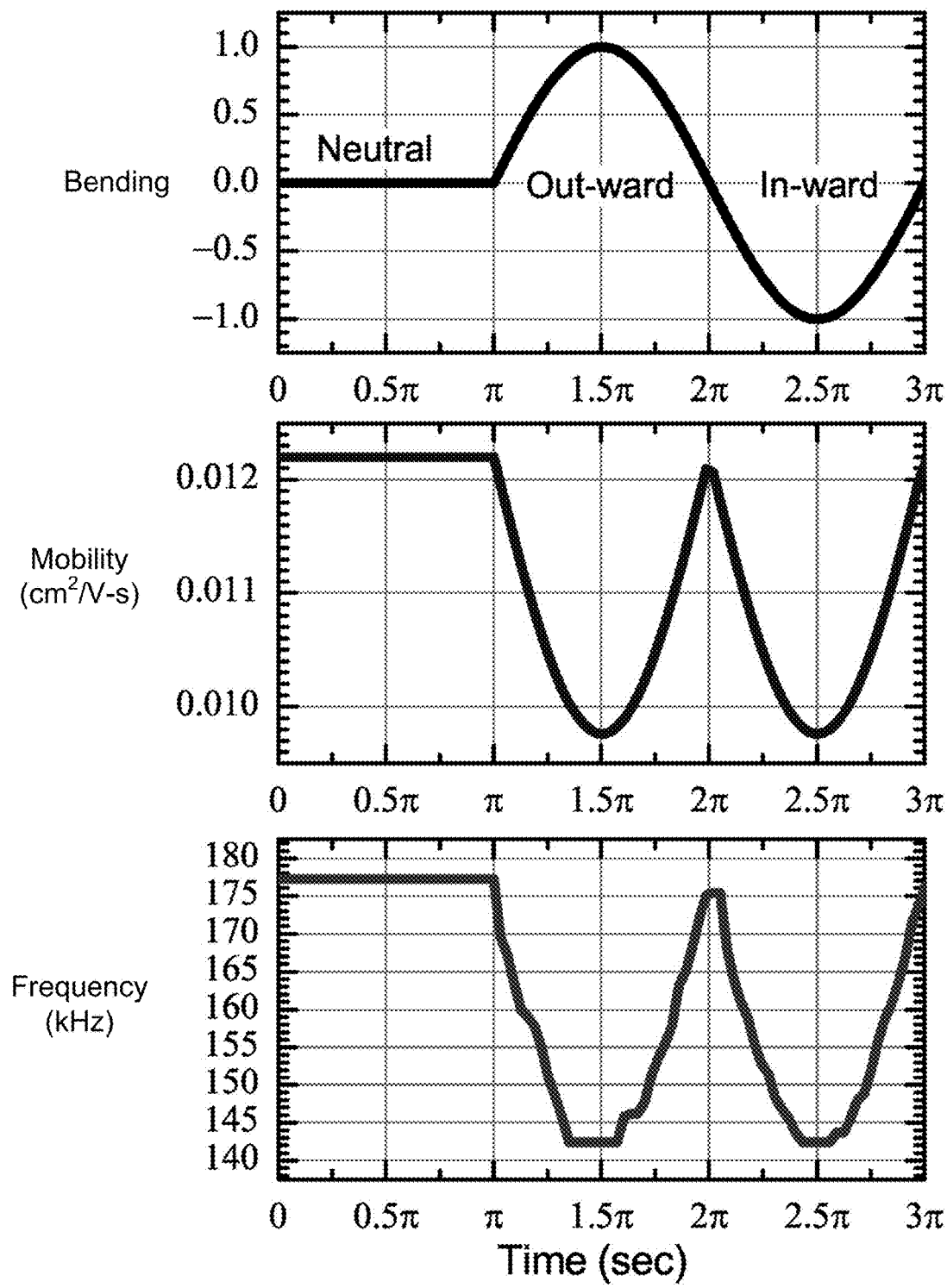
FIG. 9 illustrates changes in behavior of exemplary components of a flexible hybrid electronics system responsive to bending in accordance with various exemplary embodiments.

FIG. 9 shows that the frequency follows the changes in bending. In an exemplary embodiment, the variation in frequency generated by the ring oscillator is between 150 kHz to 175 kHz.

Figure 10:
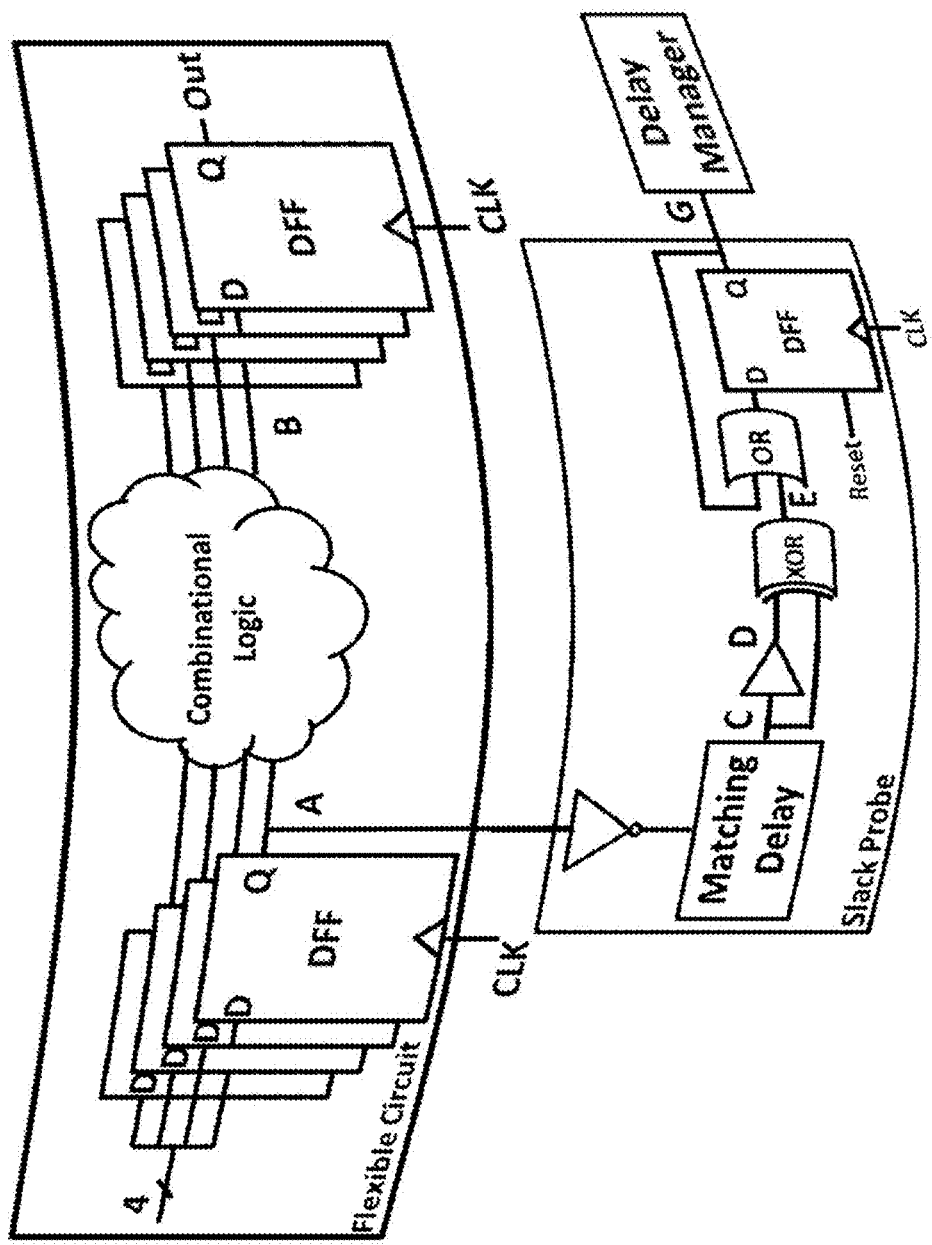
FIG. 10 illustrates an exemplary electronic system realized via application of principles of the present disclosure in accordance with various exemplary embodiments.

In various exemplary embodiments of an FHE system 100, since the bending axis and amount of bending cannot be known beforehand, the changes in timing and clock period of printed circuits are unpredictable. Accordingly, FHE system 100 may be designed to tolerate such changes. Consider the circuit in FIG. 10, which shows a combinational path between two registers. Bending can lead to setup and hold time violations as a function of the changes both in the delay of clock and combinational path. Designing for the worst case would deteriorate the performance, which is already suffering from low speeds and large feature sizes compared to silicon ICs. What is more, techniques proposed to improve the reliability by dynamically detecting timing violations have also limited applicability since they would be also affected by bending.

Timing and synchronization in flexible circuits are complicated by factors including supply-voltage, thermal, parameter variations, and bending. Therefore, asynchronous, or globally asynchronous locally synchronous (GALS) communication, and latency insensitive design techniques are desirably utilized in connection with FHE system 100. GALS is particularly attractive since different synchronous rigid ICs can communicate over a network composed of asynchronous routers.

SoP Design Challenges. Partitioning: While putting more functionality to a large conventional silicon IC would maximize the integration density, and deliver the largest processing capability, it could undermine the advantages of flexibility, and increase the manufacturing cost, power density, and surface temperature. The latter has utmost importance since exemplary FHE systems 100 are expected to be worn and potentially touch users' skin. Furthermore, flexible electronics technology is changing rapidly to alter the cost/benefit dynamics. Therefore, principles of the present disclosure contemplate novel techniques for partitioning the functionality among multiple conventional ICs and flexible circuits while meeting the quality objectives, such as level of flexibility, surface temperature, power, and performance. In some embodiments, exemplary systems and methods utilize partitioning algorithms which have multi-level objective functions with tight quality objective constraints.

Power and Thermal Management:

Exemplary wearable systems, such as low-cost wristbands that can be used in hospitals, baby monitoring systems and smart shirts for athletics, will be in contact with the human body. Since neither active cooling nor traditional passive heat sinks can be used on flexible substrates, even a transient increase in power consumption, which could happen in the order of milliseconds, can rapidly raise the temperature. What is more, exemplary FHE systems 100 need to cope with strain induced timing changes illustrated above, for example using dynamic voltage-frequency scaling. Therefore, novel cooling and thermal management techniques, as well as accurate power and thermal models targeting SoPs, may be utilized, in order to prevent undesirable thermal behavior.

Reliability:

Different types of flexible transistors exhibit varying levels of reliability. In addition to the material properties, bending also affects the reliability, since it changes the electrical characteristics. For example, the drain current of the ultraflexible pentacene FETs changes by about 10% after 160,000 bending cycles. As a direct result of material defects, flexible circuits—and hence, FHE system 100—are prone to failures. The heterogeneity of the SoP architectures disclosed herein can be used to provide fault tolerance. Unlike traditional designs where area and wiring resources are scarce, the large area benefits of the flexible substrates can be used to provide redundancy in routers and network links.

Integration and I/O Interfaces:

Integrating flexible substrate and rigid components together to form FHE system 100 poses unique interface and bonding challenges. Robust interfaces between the CMOS ICs and flexible circuits may be utilized. The physical contact and adhesive (e.g., soldering) between the rigid component and flexible substrate determines the maximum breaking force $P_{max}$ that can be applied. A stronger bond will increase the flexibility of the material by allowing more force to be applied. Another challenge is getting data in and out of SoP architectures. Traditional wired interfaces are difficult to implement in flexible form, so in various exemplary embodiments, FHE system 100 utilizes wireless interfaces, for example using RFICs. These interfaces enable FHE system 100, for example wearable SoPs, to seamlessly connect to the IoT devices with low power overhead.

Security for SoP Systems:

Since the importance of security amplifies with increasing use of wearable devices with access to personal data, security is an important aspect of SoP architecture design. While the wireless connectivity with SoPs can be secured following traditional approaches, securing the integrity of the SoP architectures in the presence of compromised flexible circuits and rigid devices is a new challenge. Hardware security has received significant attention due to increased concerns about maliciously inserted hardware trojans, which can tamper with the functionality, bypass or disable security features, leak sensitive information, or even cause destruction. Exemplary FHE system 100 may be configured to take advantage of device security techniques customized for flexible electronics.

Figure 11A:
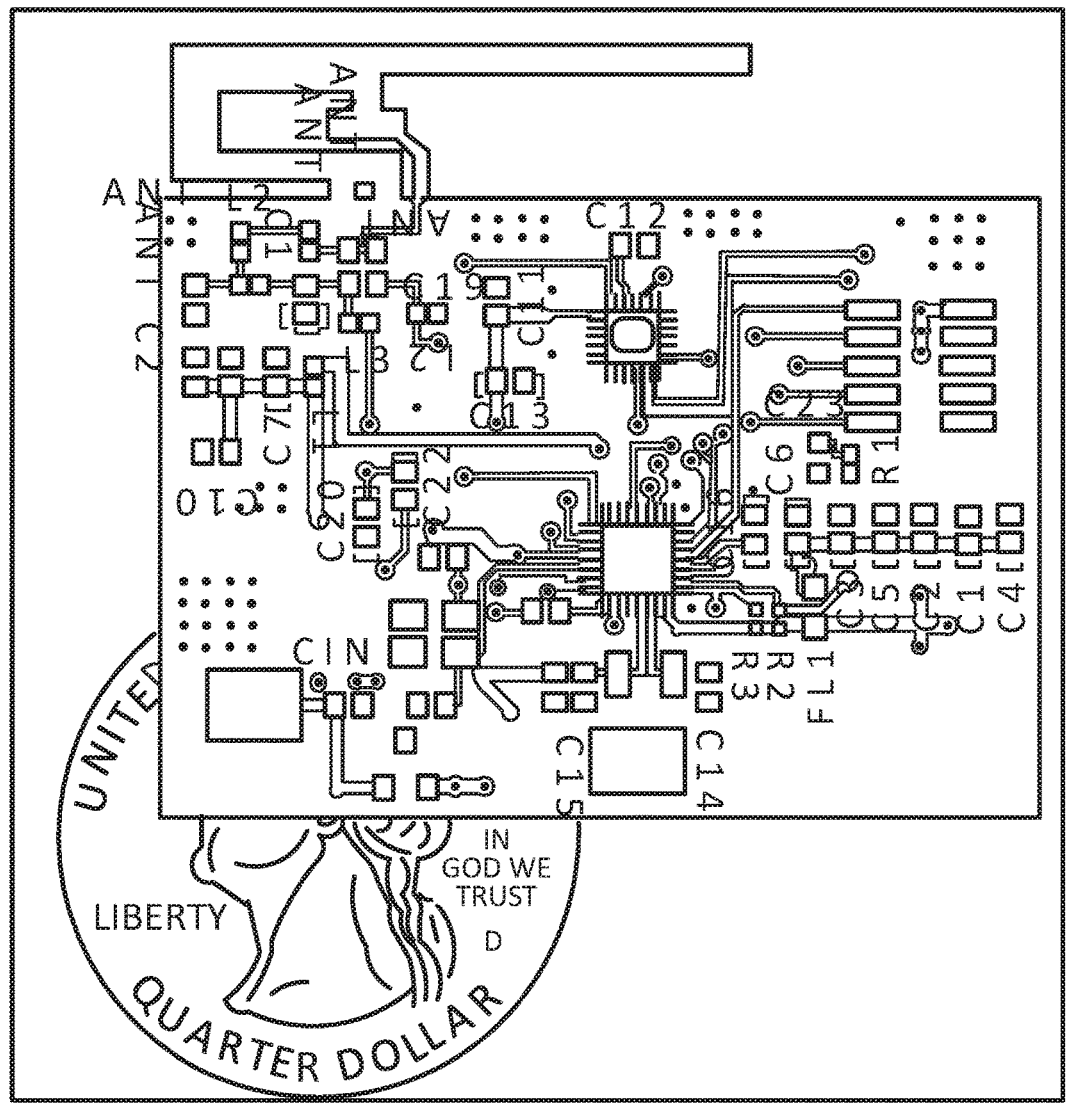
FIG. 11A illustrates a flexible substrate and electronic connections of an exemplary flexible hybrid electronics system in accordance with an exemplary embodiment, shown against a coin for scale.
Figure 11B:
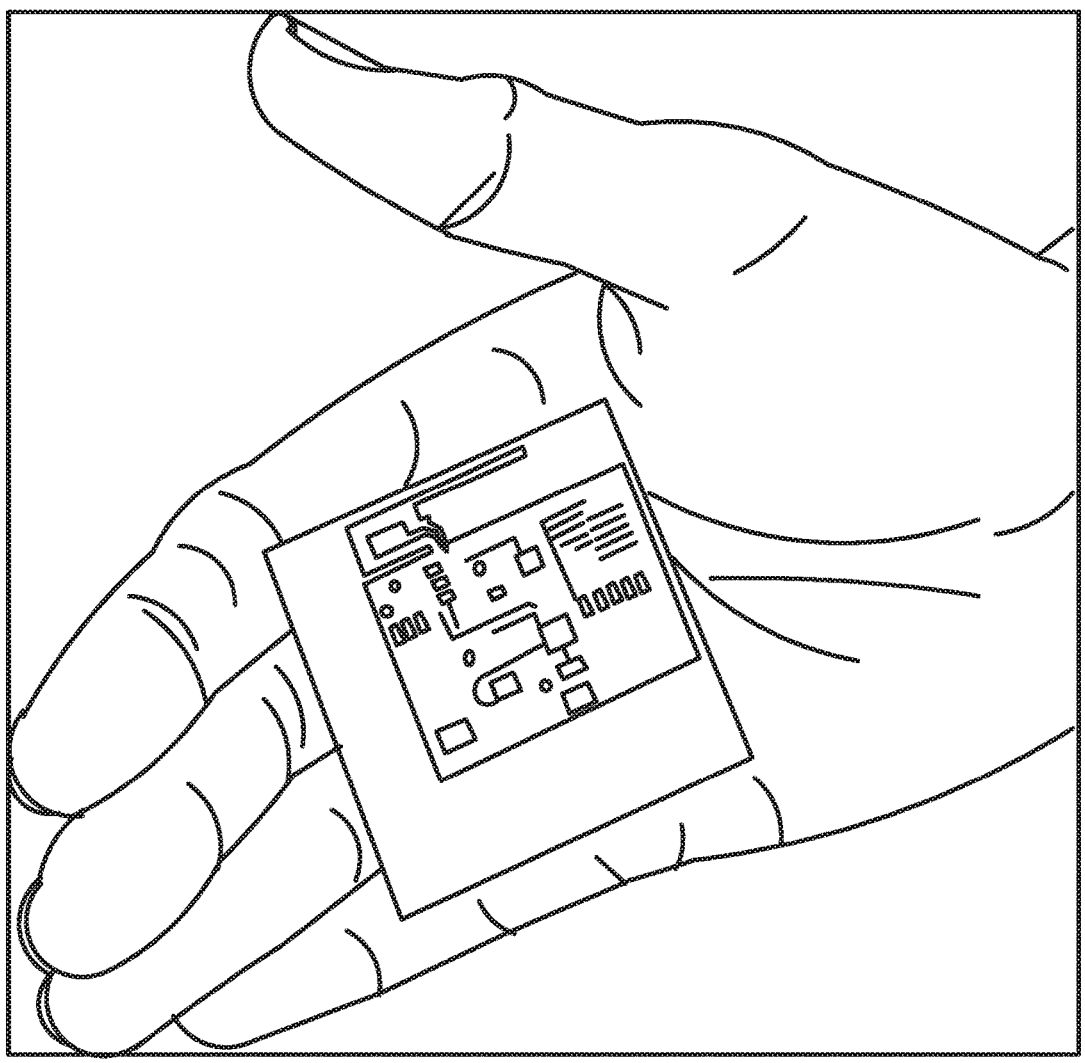
FIG. 11B illustrates an assembled flexible hybrid electronics system in accordance with an exemplary embodiment, shown against a human hand for scale.

In various exemplary embodiments, with reference now to FIGS. 11A and 11B, FHE system 100 may be configured with various functions, for example as a wearable device. FHE system 100 illustrated in FIGS. 11A and 11B is configured for motion processing and tracking, for example for use as a fitness device, gesture recognition device, and/or the like. In one exemplary embodiment, FHE system 100 utilizes the components listed in Table 1 below. It will be appreciated, however, that FHE system 100 may comprise any suitable number and type of electronic components, coupled to a flexible substrate in accordance with the layout principles disclosed herein.

TABLE 1

| Type | Components | Total no of components | Total area (mm$^2$) |
|---|---|---|---|
| Rigid | Microcontroller (CC2650F128RSM) | 1 | 16 |
| | Motion Processing Unit (MPU9250) | 1 | 9 |
| | Oscillator1 (32.768 KHz) | 1 | 4.8 |
| | Oscillator2 (24 MHz) | 1 | 8 |
| | Voltage regulator | 1 | 7.5 |
| | Passive elements | 41 | 3.48 |
| Semi-Flexible | Copper plane + Antenna | 1 | 1332.51 |
| Flexible | Polyimide substrate | 1 | 2500 |
| Debug circuits | JTAG header | 1 | 45.72 |
| | Power test points | 2 | 26.98 |

In various exemplary embodiments, FHE system 100 can be worn, have arbitrary shapes to surround objects, and incorporate multiple functions. Moreover, combination with the CMOS technology enables integrated sensing, powerful computation and communication in a truly wearable form factor. Hence, FHE can help in transforming personalized computing by providing a systematic approach to design wearable systems and arbitrarily shaped objects, such as electronic patches. In particular, SoPs equipped with physiological, biochemical, and/or motion sensing capabilities can be used in wireless body area networks (WBANs), which interconnect a variety of sensing/actuating nodes in or on the body through an energy-aware wireless network.

A promising application of the FHE technology is in assistive IoT technologies. For example, FHE principles can be used to design electronic patches capable of motion processing and wireless communication. These patches can be placed on the arms and legs of the people suffering from movement disorders. Then, the movement of the patient can be analyzed anytime and anywhere. This is in stark contrast to the current practice, where a patient has to go to a clinic for examination. Likewise, this type of a patch can be used for gesture recognition, translating the sign language, and facilitating human-machine communication.

In addition to motion sensor patches, more complex systems such as sensors for Electroencephalography (EEG) and Electromyography (EMG) signals can be made wearable. These sensors can enable wireless control of surrounding IoT devices like a wheel chair. The EEG and EMG sensor systems combine several stages: sensing, non trivial processing of raw electrode signals, and communicating the user intent. Current solutions for processing require a computer, while fully flexible technology lacks the computing power. Thus, SoP designs such as FHE system 100 can be suitably applied to these applications by combining the powerful rigid ICs for processing with the flexible lightweight form factor for wearable electronics.

In an exemplary embodiment, to demonstrate the utility of the SoP concept, an exemplary FHE system 100 was developed as illustrated in FIGS. 11A and 11B. In this exemplary embodiment, FHE system 100 comprises a gesture recognition device with rigid ICs and thin copper interconnects 130 on a 25 µm flexible Polyimide substrate. The device is capable of transmitting Gyroscope and Accelerometer data using a 2.4 GHz inverted-F patch antenna to another device with Bluetooth capability. Since the return loss of flexible antennas, such as a bow-tie antenna, may increase with bending, the flexible antenna of FHE system 100 was tested under different bending scenarios. We confirmed that the center frequency of our inverted-F antenna and characterized the received signal power as a function of bending. This shows promise for future inter- and intra-SoP connectivity using wireless transceivers.

Principles of the present disclosure may incorporate and/or utilize principles of flexible and/or stretchable electronic communications networks as disclosed in "Extending Networks from Chips to Flexible and Stretchable Electronics," (Ujjwal Gupta and Umit Y. Ogras), in *Proc. of Intl. Symp. on Networks-on-chip*, IEEE August 2016, the contents of which are hereby incorporated by reference for all purposes. Moreover, principles of the present disclosure may incorporate and/or utilize principles of optimization for flexible electronics as disclosed in "Multi-Objective Design Optimization for Flexible Hybrid Electronics" (G. Bhat et al.,) in *Proc. of Intl. Conf. on Computer-Aided Design (ICCAD)* 2016, the contents of which are hereby incorporated by reference for all purposes.

While the principles of this disclosure have been shown in various embodiments, many modifications of structure, arrangements, proportions, the elements, materials and components, used in practice, which are particularly adapted for a specific environment and operating requirements may be used without departing from the principles and scope of this disclosure. These and other changes or modifications are intended to be included within the scope of the present disclosure and may be expressed in the following claims.

The present disclosure has been described with reference to various embodiments. However, one of ordinary skill in the art appreciates that various modifications and changes can be made without departing from the scope of the present disclosure. Accordingly, the specification is to be regarded in an illustrative rather than a restrictive sense, and all such modifications are intended to be included within the scope of the present disclosure. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Also, as used herein, the terms "coupled," "coupling" or any other variation thereof, are intended to cover a physical connection, an electrical connection, a magnetic connection, an optical connection, a communicative connection, a functional connection, and/or any other connection. When language similar to "at least one of A, B, or C" or "at least one of A, B, and C" is used in the claims, the phrase is intended to mean any of the following: (1) at least one of A; (2) at least one of B; (3) at least one of C; (4) at least one of A and at least one of B; (5) at least one of B and at least one of C; (6) at least one of A and at least one of C; or (7) at least one of A, at least one of B, and at least one of C.

What is claimed is:

1. A method for making a flexible hybrid electronic system, the method comprising:
   providing a flexible substrate;
   selecting a location of a first rigid integrated circuit chip and a second rigid integrated circuit chip on the flexible substrate, wherein the selecting maximizes the potential deflection of the flexible substrate after the first rigid integrated circuit chip and the second rigid integrated circuit chip are coupled to the flexible substrate, and wherein the selecting utilizes a nonlinear optimization of the form:

maximize $\Delta(x_r, y_r, \theta, l, b, \beta, W)$ subject to $g_c: 0 \leq x_r, y_r, x_s, y_s, x_p, y_p, x_q, y_q \leq L$, $g_\beta: 0 \leq \beta \leq \pi/2$, $g_\theta: -\min(\beta) \leq \theta \leq -\max(\beta) + \pi/2$, $g_l: l \geq L_{min}, g_b: b \geq L_{min}$ Area of bounding-box: $B_A = l \times b$, $$\sum_{i=1}^{N} w_i = 1, w_i \geq 0 \, \forall \, i$$

wherein:
the flexible substrate is defined as a square ABCD having coordinates A(0,0), B(L,0), C(L,L), and D(0,L);
a bounding-box comprises a rectangle pqrs within square ABCD having an orientation angle θ with respect to a horizontal edge of the flexible substrate;
$B_A$=the area of the bounding-box;
l=a free variable defining a length of the bounding-box;
b=a free variable defining a width of the bounding-box;
β=a set of bending angles [$\beta_1, \beta_2, \beta_3, \ldots, \beta_n$] having respective relative importance W=[$w_1, w_2, w_3, \ldots w_n$];
$g_c$=a constraint ensuring that the bounding-box remains within the flexible substrate during the optimization;
$g_\beta$=a bending angle;
$g_\theta$=a constraint preventing a symmetric solution;
$g_l$=a constraint representing a minimum length of the bounding-box; and
$g_b$=a constraint representing a minimum width of the bounding-box;
wherein the first integrated circuit chip and the second integrated circuit chip are coupled to the flexible substrate within the area defined by the bounding-box, and
wherein all quantities except θ remain positive throughout the optimization;
coupling a first rigid integrated circuit chip and a second rigid integrated circuit chip to the flexible substrate; and
coupling the first rigid integrated circuit chip to the second rigid integrated circuit chip via a flexible electronic interconnect component.

2. The method of claim 1, wherein the location of the first rigid integrated circuit chip on the flexible substrate is selected to maximize the flexibility of the flexible hybrid electronic system.

3. The method of claim 1, wherein the location of the first rigid integrated circuit chip on the flexible substrate and the location of the second rigid integrated circuit chip on the flexible substrate are selected to maximize the flexibility of the flexible hybrid electronic system over at least two bending axes.

4. The method of claim 1, wherein the first rigid integrated circuit chip and the second rigid integrated circuit chip are configured to tolerate timing variations arising from bending of the flexible substrate.

5. The method of claim 4, wherein the timing variations exceed 10% of a clock speed of the first rigid integrated circuit chip.

6. The method of claim 1, wherein the flexible hybrid electronic system is a wearable device.

7. The method of claim 1, wherein the flexible substrate comprises polyimide.

8. The method of claim 1, wherein the first rigid integrated circuit chip and the second rigid integrated circuit chip are coupled to the substrate at locations symmetrically opposed to one another across an axis of bending of the flexible substrate.

9. The method of claim 1, wherein the flexible hybrid electronic system remains operative in the presence of bending of the flexible substrate in three axes.

10. The method of claim 1, wherein the flexible electronic interconnect component comprises a wireless connection.

11. The method of claim 1, wherein the first rigid integrated circuit chip and the second rigid integrated circuit chip are linked via a globally asynchronous locally synchronous (GALS) communication protocol.

12. The method of claim 1, further comprising coupling a selected number n rigid integrated circuit chips to the flexible substrate such that the flexible hybrid electronic system is operable when the flexible substrate is deflected by an angle equal to or less than a target angle θ.

13. The method of claim 1, wherein a size of the first rigid integrated circuit chip is selected utilizing an equation of the form:

$$\delta_{HF} = \frac{(L-l)^3 \cdot P_{max}}{3 \cdot E \cdot I}$$

wherein:
$\delta_{HF}$=a maximum deflection of the flexible hybrid electronic system;
$P_{max}$=a maximum force sustainable by the flexible substrate without breakage;
E=a modulus of elasticity of the flexible substrate;
L=a length of the flexible substrate in a first direction;
l=a length of the first rigid integrated circuit chip in the first direction; and
I=a moment of area.

* * * * *